US008633785B2

(12) United States Patent
Chang et al.

(10) Patent No.: US 8,633,785 B2
(45) Date of Patent: Jan. 21, 2014

(54) MARCHAND BALUN CIRCUIT

(75) Inventors: En-Shuo Chang, New Taipei (TW); Po-Chuan Hsieh, New Taipei (TW); Ying-Tso Lai, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 110 days.

(21) Appl. No.: 13/326,226

(22) Filed: Dec. 14, 2011

(65) Prior Publication Data

US 2013/0093530 A1 Apr. 18, 2013

(30) Foreign Application Priority Data

Oct. 12, 2011 (TW) ............................ 100136865 A

(51) Int. Cl.
*H03H 7/48* (2006.01)
*H03H 7/38* (2006.01)

(52) U.S. Cl.
USPC ............................................... 333/26; 333/32

(58) Field of Classification Search
USPC ..................................................... 333/26, 32
See application file for complete search history.

(56) References Cited

U.S. PATENT DOCUMENTS

| | | | | |
|---|---|---|---|---|
| 6,388,539 | B1 * | 5/2002 | Rice | 333/25 |
| 6,621,370 | B1 * | 9/2003 | Dao | 333/25 |
| 6,819,199 | B2 * | 11/2004 | Burns et al. | 333/26 |
| 7,880,557 | B2 * | 2/2011 | Jiang | 333/26 |
| 7,961,064 | B2 * | 6/2011 | Kearns et al. | 333/109 |

* cited by examiner

*Primary Examiner* — Robert Pascal
*Assistant Examiner* — Kimberly Glenn
(74) *Attorney, Agent, or Firm* — Atlis Law Group, Inc.

(57) ABSTRACT

A Marchand balun circuit includes a Marchand balun, an unbalanced matching circuit, and a balanced matching circuit. The Marchand balun includes an unbalanced terminal, and two balanced terminals. The unbalanced matching circuit includes a first and the second impedances which are connected between the unbalanced terminal and ground in series, and a first resistor which is connected between ground and a connection node of the first and the second impedances. The balanced matching circuit includes a third and a fourth impedances which are connected between one balanced terminal and ground in series, a fifth and a sixth impedance which are connected between the other balanced terminal and ground in series, a second resistor which is connected between ground and a connection node of the third and the fourth impedances, and a third resistor which is connected between ground and a connection node of the fifth and the sixth impedances.

6 Claims, 2 Drawing Sheets

MARCHAND BALUN CIRCUIT

BACKGROUND

1. Technical Field

The present disclosure relates to baluns, particularly, to a Marchand balun circuit.

2. Description of Related Art

As is known, Marchand balun is one of the most popular forms of microwave balun used to convert unbalanced signals to balanced signals. As shown in FIG. 2, a conventional Marchand balun 10 includes four coupled lines 101 which form six terminals. The six terminals respectively are two grounded terminals, one terminal which is hung up, one unbalanced terminal NP, and two balanced terminals BP. The unbalanced terminal NP is used to connect to an unbalanced device, such as a coaxial cable. The two balanced terminals BP are used to connect to balanced device, such as a dipole antenna. The Marchand balun receives unbalanced signals from the unbalanced device via the unbalanced terminal NP, and converts the unbalanced signals to balanced signals, and then outputs the balanced signals, to the balanced device via the two balanced terminals BP.

However, the conventional Marchand balun does not include matching circuit, and is difficult to control the frequency response and the bandwidth of the balanced signals that are output.

Therefore, it is desirable to provide a Marchand balun circuit to overcome the described limitations.

BRIEF DESCRIPTION OF THE DRAWINGS

Many aspects of the present disclosure are better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure will now be described in detail, with reference to the accompanying drawings.

Figure 1:
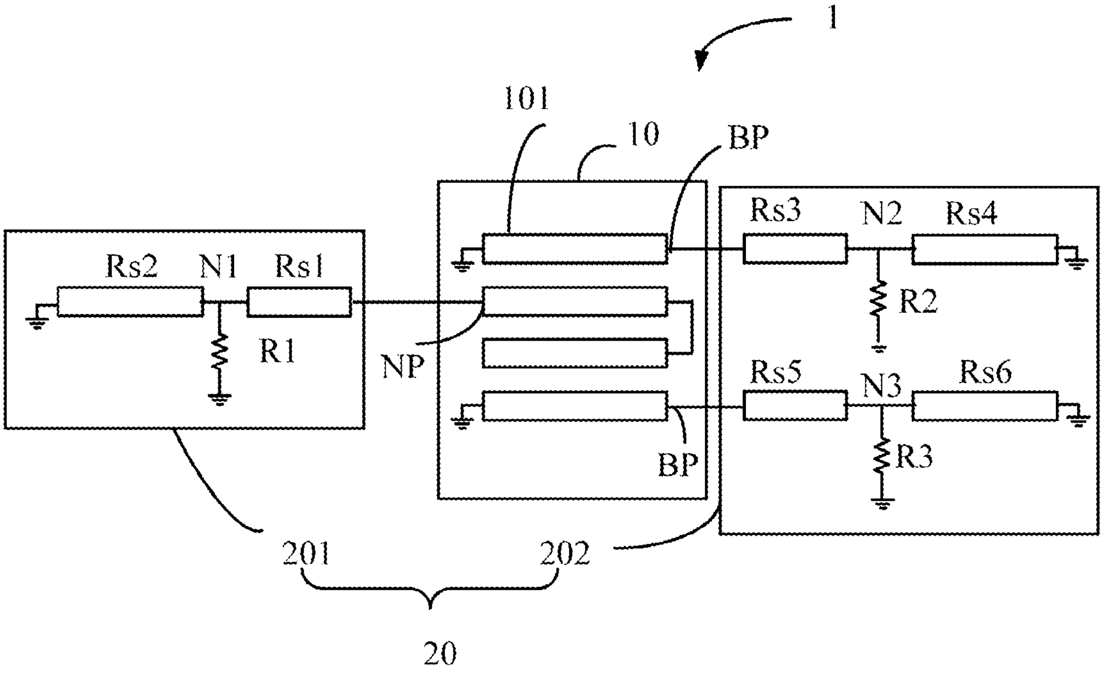
FIG. 1 is a schematic diagram of a Marchand balun circuit, in accordance with an exemplary embodiment.
Figure 2:
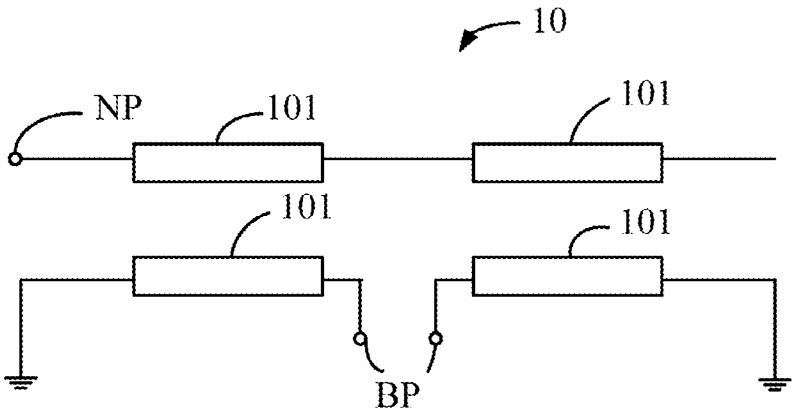
FIG. 2 (Related Art)
FIG. 2 is a schematic diagram of a conventional Marchand balun.

Referring to FIG. 1, a Marchand balun circuit 1 includes a Marchand balun 10 and a matching circuit 20. The Marchand balun 10 includes two grounded terminals (not labeled), a terminal (not labeled) which is hung up, an unbalanced terminal NP, and two balanced terminals BP. The matching circuit 20 includes an unbalanced matching circuit 201 and a balanced matching circuit 202. The unbalanced matching circuit 201 is connected to the unbalanced terminal NP and is used to match the unbalanced terminal NP. The balanced matching circuit 202 is connected to the balanced terminal BP, and is used to match the balanced terminal BP.

In detail, as shown in FIG. 1, the unbalanced matching circuit 201 includes a first resistor R1, a first impedance Rs1, and a second impedance Rs2. The first impedance Rs1 and the second impedance Rs2 are connected between the unbalanced terminal NP and ground in series. The first resistor R1 is connected between the ground and a connection node N1 of the first impedance Rs1 and the second impedance Rs2.

The balanced matching circuit 202 includes a second resistor R2, a third resistor R3, a third impedance Rs3, a fourth impedance Rs4, a fifth impedance Rs5, and a sixth impedance Rs6. The third impedance Rs3 and the fourth impedance Rs4 are connected between one balanced terminal BP and the ground in series. The fifth impedance Rs5 and the sixth impedance Rs6 are connected between the other balanced terminal BP and the ground in series. The second resistor R2 is connected between the ground and a connection node N2 of the third impedance Rs3 and the fourth impedance Rs4. The third resistor R3 is connected between the ground and a connection node N3 of the fifth impedance Rs5 and the sixth impedance Rs6.

The connection node N1 is used to connect to an unbalanced device, such as a coaxial cable, a probe, and etc, and the Marchand balun 10 receives unbalanced signals from the unbalanced device via the unbalanced terminal NP and the connection node N1. The connection nodes N2, N3 are used to connect to a balanced device, such as a dipole antenna, and etc, then the Marchand balun 10 converts the unbalanced signals to balanced signals and outputs the balanced signals to the balanced device via the two balanced terminals BP and the connection nodes N2, N3.

In the embodiment, the impedance value of the impedances and the resistance value of the resistors of the unbalanced matching circuit 201 are determined by parameters of the unbalanced device connected to the unbalanced matching circuit 201, such as the diameter of the coaxial cable, or the resistance value of the probe. The impedance value of the impedances and the resistance value of the resistors of the balanced matching circuit 202 are determined by the parameters of the balanced device, such as the length of the dipole antenna.

Therefore, in the present disclosure, the Marchand balun circuit 1 can better control the frequency response and bandwidth of the balanced signals that it converts.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the present disclosure.

What is claimed is:

1. A Marchand balun circuit comprising:

a Marchand balun comprising an unbalanced terminal and two balanced terminals; and a matching circuit comprising:

an unbalanced matching circuit comprising a first resistor, a first impedance, and a second impedance, wherein, the first impedance and the second impedance are connected between the unbalanced terminal and ground in series, the first resistor is connected between the ground and a first connection node of the first impedance and the second impedance, wherein the first connection node is configured to connect to an unbalanced device; and a balanced matching circuit comprising a second resistor, a third resistor, a third impedance, a fourth impedance, a fifth impedance, and a sixth impedance, wherein, the third impedance and the fourth impedance are connected between one balanced terminal and the ground in series, the fifth impedance and the sixth impedance are connected between the other balanced terminal and the ground in series, the second resistor is connected between the ground and a second connection node of the third impedance and the fourth impedance, the third resistor is connected between the ground and a third connection node of the fifth impedance and the sixth impedance, wherein the second connection node and the third connection node are configured to connect to a balanced device.

2. The Marchand balun circuit according to claim 1, wherein the impedance value of the impedances and the resistance value of the resistors of the unbalanced matching circuit are determined by parameters of the unbalanced device connected to the unbalanced matching circuit.

3. The Marchand balun circuit according to claim 2, wherein the unbalanced device is a coaxial cable and the parameter is the diameter of the coaxial cable.

4. The Marchand balun circuit according to claim 2, wherein the unbalanced device is a probe and the parameter is a resistance value of the probe.

5. The Marchand balun circuit according to claim 2, wherein the impedance value of the impedances and the resistance value of the resistors of the balanced matching circuit are determined by the parameters of the balanced device.

6. The Marchand balun circuit according to claim 5 wherein the balanced device is a dipole antenna, the parameter is a length of the dipole antenna.

* * * * *